(12) United States Patent
Sharf et al.

(10) Patent No.: US 9,958,497 B2
(45) Date of Patent: May 1, 2018

(54) TESTING PLUGGABLE MODULE

(71) Applicant: TYCO ELECTRONICS CORPORATION, Berwyn, PA (US)

(72) Inventors: Alex Michael Sharf, Harrisburg, PA (US); Alan Weir Bucher, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 58 days.

(21) Appl. No.: 15/252,288

(22) Filed: Aug. 31, 2016

(65) Prior Publication Data

US 2018/0059167 A1 Mar. 1, 2018

(51) Int. Cl.
| | |
|---|---|
| *G01R 31/28* | (2006.01) |
| *H01R 13/6581* | (2011.01) |
| *H01R 13/66* | (2006.01) |
| *H01R 13/717* | (2006.01) |
| *G01R 1/067* | (2006.01) |
| *G01R 1/02* | (2006.01) |

(52) U.S. Cl.
CPC ........... *G01R 31/282* (2013.01); *G01R 1/025* (2013.01); *G01R 1/06766* (2013.01); *H01R 13/6581* (2013.01); *H01R 13/6683* (2013.01); *H01R 13/717* (2013.01)

(58) Field of Classification Search
CPC . G01R 1/06766; G01R 1/025; H01R 13/6683
See application file for complete search history.

(56) References Cited

U.S. PATENT DOCUMENTS

| | | | | |
|---|---|---|---|---|
| 6,786,653 | B1* | 9/2004 | Hwang | ................. H01R 13/633 |
| | | | | 385/92 |
| 7,108,523 | B2* | 9/2006 | Hartman | ............ H01R 13/6582 |
| | | | | 439/157 |
| 7,387,527 | B2 | 6/2008 | Kim et al. | |
| 2003/0156801 | A1* | 8/2003 | Hwang | ................. G02B 6/4292 |
| | | | | 385/92 |

* cited by examiner

*Primary Examiner* — Jermele M Hollington
*Assistant Examiner* — Alvaro Fortich

(57) ABSTRACT

A testing pluggable module includes a pluggable body extending between a front end and a mating end defining a mating interface with a communication connector of a receptacle assembly. The mating end is receivable in a module cavity of the receptacle assembly to mate with the communication connector. The pluggable body has an exterior forward of the mating end. The testing pluggable module includes an internal circuit board held in the pluggable body having a testing circuit operating at least one testing function. The testing pluggable module includes a user interface on the exterior of the pluggable body. The user interface has an input configured to operably control the at least one testing function of the testing circuit.

20 Claims, 3 Drawing Sheets

TESTING PLUGGABLE MODULE

BACKGROUND OF THE INVENTION

The subject matter herein relates generally to testing pluggable modules.

At least some known communication systems include receptacle assemblies, such as input/output (I/O) connector assemblies, that are configured to receive a pluggable module and establish a communicative connection between the pluggable module and an electrical communication connector of the receptacle assembly. As one example, a known receptacle assembly includes a cage member that is mounted to a circuit board and configured to receive a small form-factor pluggable (SFP) transceiver in an elongated cavity of the cage member. The pluggable module and the electrical connector have respective electrical contacts that engage one another to establish a communicative connection.

Specialty modules are used for testing purposes of the various components of the communication system. For example, testing modules may be used for diagnostic testing of the communication connector of the host system. The testing modules may be used for thermal testing of the cage member or for thermal testing of aspects of the pluggable module. Cage designers, pluggable module designers and system builders have a need for the testing modules. The testing modules are designed to be compatible with standard receptacle assemblies. For examples, the testing modules have similar form factors to the I/O modules. However, conventional testing processes may be rather complicated. For example, the testing is typically performed by a user accessing the host system using a separate testing device, such as linking a computer to the host system and running tests through the host system. Control of the testing module is performed through the host system with external circuitry or componentry. Data is received by the user through the host system. The testing is thus complicated and time consuming.

Accordingly, there is a need for an improved testing module that simplifies testing of components in a communication system.

BRIEF DESCRIPTION OF THE INVENTION

In one embodiment, a testing pluggable module is provided including a pluggable body extending between a front end and a mating end defining a mating interface with a communication connector of a receptacle assembly. The mating end is receivable in a module cavity of the receptacle assembly to mate with the communication connector. The pluggable body has an exterior forward of the mating end. The testing pluggable module includes an internal circuit board held in the pluggable body having a testing circuit operating at least one testing function. The testing pluggable module includes a user interface on the exterior of the pluggable body. The user interface has an input configured to operably control the at least one testing function of the testing circuit.

In another embodiment, a testing pluggable module is provided including a pluggable body extending between a front end and a mating end defining a mating interface with a communication connector of a receptacle assembly. The mating end is receivable in a module cavity of the receptacle assembly to mate with the communication connector. The pluggable body has an exterior forward of the mating end. The testing pluggable module includes an internal circuit board held in the pluggable body having a testing circuit operating at least one testing function. The testing circuit has an output based on the at least one testing function. The testing pluggable module having a user interface on the exterior of the pluggable body having an input configured to operably control the at least one testing function of the testing circuit. The testing pluggable module has a display on the exterior of the pluggable body. The display receives the output from the testing circuit and displays information indicative of the output.

In a further embodiment, a testing pluggable module is provided including a pluggable body extending between a front end and a mating end defining a mating interface with a communication connector of a receptacle assembly. The mating end is receivable in a module cavity of the receptacle assembly to mate with the communication connector. The pluggable body has an exterior forward of the mating end. The testing pluggable module includes an internal circuit board held in the pluggable body having a testing circuit operating at least one testing function. The testing circuit has an output based on the at least one testing function. The testing pluggable module includes a display on the exterior of the pluggable body, the display receiving the output from the testing circuit and displaying information indicative of the output.

DETAILED DESCRIPTION OF THE INVENTION

Embodiments set forth herein include pluggable modules with smart features used for testing communication system components. For example, the pluggable modules may be used for testing thermal properties of the communication system, such as the cage, which may be used for cage design, heat sink design, pluggable module body design, networking design, and the like. The pluggable modules may be used for electrical testing, such as for diagnostic testing of the communication connector or other circuitry. The testing pluggable module may allow for user input directly into the system through the testing pluggable module, such as with integrated user interface components. The testing pluggable module may provide user feedback from the module and/or from the system through the testing pluggable module, such as with an integrated display.

Figure 1:
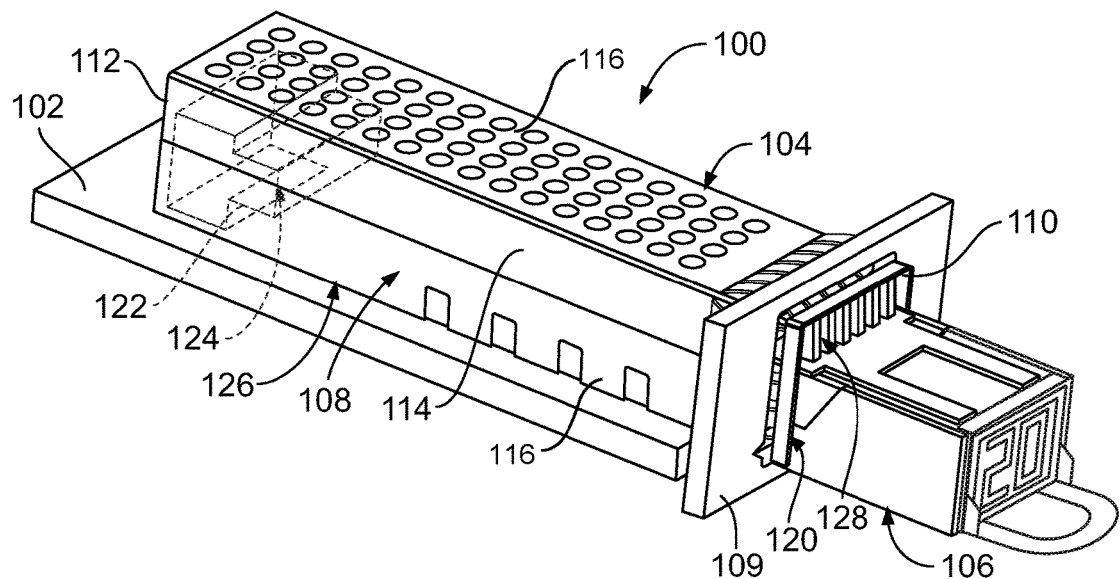
FIG. 1 is a front perspective view of a communication system including a testing pluggable module in accordance with an embodiment.

FIG. 1 is a front perspective view of a communication system 100 in accordance with an embodiment. The communication system 100 includes a circuit board 102, a receptacle assembly 104 mounted to the circuit board 102, and a testing pluggable module 106 (sometimes simply referred to as pluggable module 106) that is configured to be received in the receptacle assembly 104. The circuit board 102 may be a daughter card or a mother board and include conductive traces (not shown) extending therethrough. Optionally, the testing pluggable module 106 may be communicatively coupled to the receptacle assembly 104, such as to a communication connector, to send and/or receive data signals with components of the communication system 100.

The communication system 100 may be part of or used with telecommunication systems or devices. For example, the communication system 100 may be part of or include a switch, router, server, hub, network interface card, or storage system. In various embodiments, the testing pluggable module 106 is configured to transmit data signals with the communication connector of the receptacle assembly 104 for testing purposes. However, in other various embodiments, the testing pluggable module 106 does not transmit data signals with the communication connector of the receptacle assembly 104, but rather is merely physically positioned in the receptacle assembly 104 for other testing purposes, such as for thermal testing of various components of the communication system 100.

In the illustrated embodiment, the receptacle assembly 104 is illustrated as a single port receptacle assembly configured to receive a single pluggable module 106 (either the testing pluggable module 106 described herein or a traditional, standard input/output pluggable module used for data communication); however, the receptacle assembly 104 may be a multi-port receptacle assembly in other embodiments configured to receive pluggable modules 106 in multiple ports. For example, the multiple ports of the receptacle assembly 104 may be ganged side-by-side and/or stacked in addition to, or alternative to, ganged ports.

The testing pluggable module 106 is used for testing components of the communication system 100, such as components of the receptacle assembly 104, the circuit board 102 or of the pluggable module 106. The testing pluggable module 106 may be used for testing purposes in place of conventional communication pluggable modules, such as input/output (I/O) modules configured to be inserted into and removed from the receptacle assembly 104. For example, the testing pluggable module 106 may be used in place of a small form-factor pluggable (SFP) transceiver or quad small form-factor pluggable (QSFP) transceiver, such as those satisfying certain technical specifications for SFP or QSFP transceivers, such as Small-Form Factor (SFF)-8431. By way of example, the testing pluggable module 106 may be used in place of transceivers which are part of the SFP+ product family available from TE Connectivity. The testing pluggable module 106 has a form factor that complements the form factor of the I/O modules such that the testing pluggable module 106 may be plugged into the receptacle assembly 104 in the same manner as the I/O modules. The testing pluggable module 106 may have a mating interface that is identical to the mating interface of the I/O modules such that the testing pluggable module 106 may be mated with components of the receptacle assembly 104, such as the communication connector of the receptacle assembly 104.

The receptacle assembly 104 includes a cage member 108 that is mounted to the circuit board 102. The cage member 108 may be arranged at a bezel or panel 109 of a chassis of the system or device, such as through an opening in the panel 109. As such, the cage member 108 is interior of the device and corresponding panel 109 and the pluggable module(s) 106 is loaded into the cage member 108 from outside or exterior of the device and corresponding panel 109. Optionally, the panel 109 may include a plurality of openings each configured to receive a corresponding pluggable module 106. In other various embodiments, the opening in the panel 109 may be sized to receive multiple pluggable modules 106, such as when a multi-port receptacle assembly 104 is used.

The cage member 108 includes a front end 110 and an opposite rear end 112. The front end 110 may be provided at, and extend through an opening in, the panel 109. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the receptacle assembly 104. The pluggable module 106 is accessible to the user and viewable to the user when the pluggable module 106 is inserted into the receptacle assembly 104. As such, the pluggable module 106 may be used for testing the communication system 100. For example, the pluggable module may be interacted with and/or viewable during testing, as described in further detail below.

The cage member 108 is configured to contain or block electromagnetic interference (EMI) and guide the pluggable module(s) 106 during a mating operation. To this end, the cage member 108 includes multiple pieces assembled together to enclose the pluggable module 106. For example, the pieces may be snap-fit together and/or welded together. When the cage member 108 is mounted to the circuit board 102, the cage member 108 is electrically coupled to the circuit board 102 and, in particular, to ground planes (not shown) within the circuit board 102 to electrically ground the cage member 108. As such, the receptacle assembly 104 may reduce EMI that may negatively affect electrical performance of the communication system 100. The testing pluggable module 106 may be used to block or plug the cavity in the receptacle assembly 104, such as for EMI containment and/or shielding.

In an exemplary embodiment, the cage member 108 includes a receptacle housing 114 defined by a plurality of housing panels or walls 116, which may be formed from one or more pieces. The various walls 116 provide shielding for vulnerable areas of other components, such as by covering or shielding openings in the walls 116 of the other components. The receptacle housing 114 extends between the front end 110 and the rear end 112. The walls 116 are formed from conductive material, such as sheet metal and/or a polymer having conductive particles. In the illustrated embodiment, the pieces are stamped and formed from sheet metal. In some embodiments, the cage member 108 is configured to facilitate airflow through the cage member 108 to transfer heat (or thermal energy) away from the receptacle assembly 104 and the pluggable module(s) 106. The air may flow from inside the cage member 108 (for example, behind the panel 109) to the external environment (for example, forward of the panel 109) or from outside the cage member 108 into the interior of the cage member 108. Fans or other air moving devices may be used to increase airflow through the cage member 108 and over the pluggable module(s) 106.

The receptacle housing 114 defines a module cavity 120 extending between the front and rear ends 110, 112. The module cavity 120 receives the pluggable module 106. The module cavity 120 extends lengthwise in a direction that is parallel to the plugging axis of the pluggable module 106. For the multi-port receptacle assembly 104, multiple module cavities 120 or ports are defined for receiving multiple pluggable modules 106. In such embodiments, the module cavities 120 may be stacked vertically and/or ganged horizontally.

The receptacle assembly 104 includes a communication connector 122 (shown in phantom in FIG. 1) having a mating interface 124 for mating with the pluggable module 106. The communication connector 122 may have multiple mating interfaces when configured to mate with multiple pluggable modules 106, such as when used in a stacked cage member. The communication connector 122 is disposed at the rear end of the module cavity 120. In an exemplary embodiment, the communication connector 122 is provided at or near the rear end 112 of the cage member 108. The communication connector 122 includes electrical contacts (not shown) that are configured to be mated with the pluggable module 106. The communication connector 122 is configured to be mounted to the circuit board 102. The communication connector 122 is configured to be received in the cage member 108 through a bottom 126 of the cage member 108. For example, the cage member 108 is configured to be mounted to the circuit board 102 over the communication connector 122 such that the communication connector 122 passes through an opening in the bottom 126 as the cage member 108 is mounted to the circuit board 102.

In an exemplary embodiment, the module cavity 120 includes an airflow channel 128 that allows airflow through the module cavity 120. For example, in the illustrated embodiment, the airflow channel 128 is positioned along the top of the module cavity 120 and passes along the top of the pluggable module 106 to cool the pluggable module 106. In an exemplary embodiment, the airflow channel 128 is open at the front end 110 and at the rear end 112 to allow airflow through the module cavity 120 along the pluggable module 106. The cage member 108 includes airflow openings or vents in the cage member 108, such as at the rear end 112 and/or at the top to allow airflow therethrough. The airflow openings may be sized to limit or reduce EMI leakage through the cage member 108.

Figure 2:
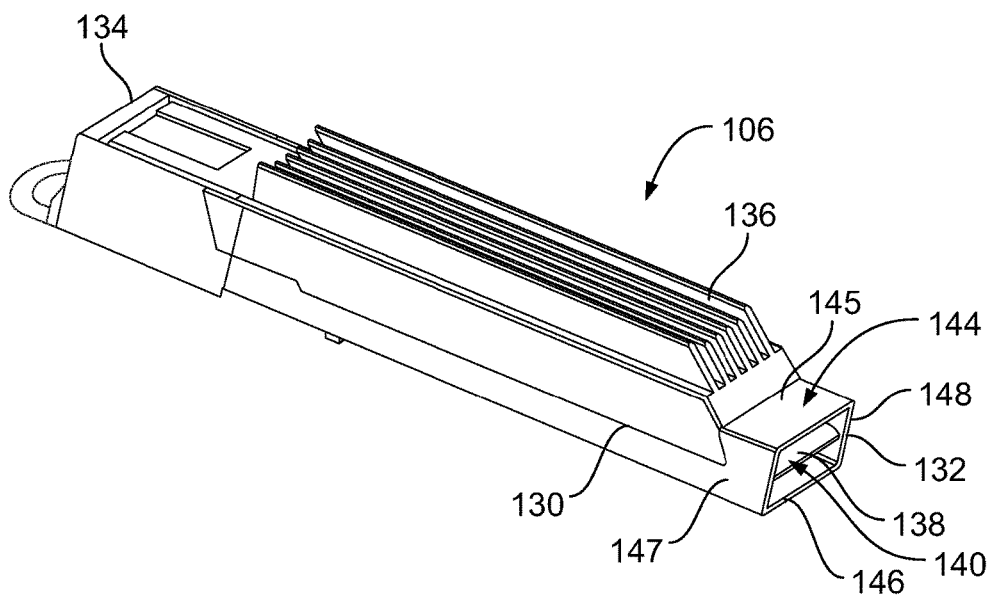
FIG. 2 is a rear perspective view of the testing pluggable module in accordance with an exemplary embodiment.

FIG. 2 is a rear perspective view of the testing pluggable module 106 in accordance with an exemplary embodiment. The testing pluggable module 106 has a pluggable body 130, which may be defined by one or more shells. The pluggable body may be thermally conductive and/or may be electrically conductive, such as to provide EMI shielding for the pluggable module 106. The pluggable body 130 includes a mating end 132 and an opposite front end 134. The mating end 132 is configured to be inserted into the module cavity 120 (shown in FIG. 1). The front end 134 is typically a cable end on conventional pluggable modules having a cable extending therefrom to another component within the system. The front end 134 is viewable and accessible from the exterior of the receptacle assembly 104 (shown in FIG. 1) and is thus considered a user end of the testing pluggable module 106 as the user end is configured to be interacted with by a user.

The pluggable body 130 includes an internal circuit board 138 that is configured to be communicatively coupled to the communication connector 122 (shown in FIG. 1). The internal circuit board 138 may be accessible at the mating end 132. The internal circuit board 138 may include components used for testing the pluggable module 106 and/or other components of the communication system 100. The internal circuit board 138 may have electrical components electrically connected thereto to form a testing circuit 140. For example, the internal circuit board 138 may have conductors, traces, pads, electronics, sensors, controllers, displays, switches, inputs, outputs, and the like associated with the internal circuit board 138, which may be mounted to the internal circuit board 138, to form the testing circuit 140 and to control operation of the testing pluggable module 106. The testing circuit 140 is operable to perform at least one testing function of the testing pluggable module 106. For example, the testing circuit 140 may be used for testing thermal properties of the communication system 100. The testing circuit 140 may be used for electrical testing, such as for diagnostic testing of the communication connector 122 or other circuitry. The testing pluggable module 106 may allow for user input directly into the system through the testing circuit 140, such as through an integrated user interface. The testing pluggable module 106 may provide user feedback from the module 106 and/or from the system 100 through the testing pluggable module 106, such as with an integrated display.

The pluggable module 106 includes an outer perimeter defining an exterior 144 of the pluggable body 130. The exterior 144 extends between the mating end 132 and the front end 134 of the pluggable module 106. The exterior 144 is defined by one or more surfaces of the pluggable body 130, which may be accessible and touchable by the user. For example, the exterior 144 may be defined by a top 145, a bottom 146 and opposite sides 147, 148 of the pluggable body 130. The front end 134 may define a portion of the exterior 144, which may be accessible and touchable by the user.

Figure 3:
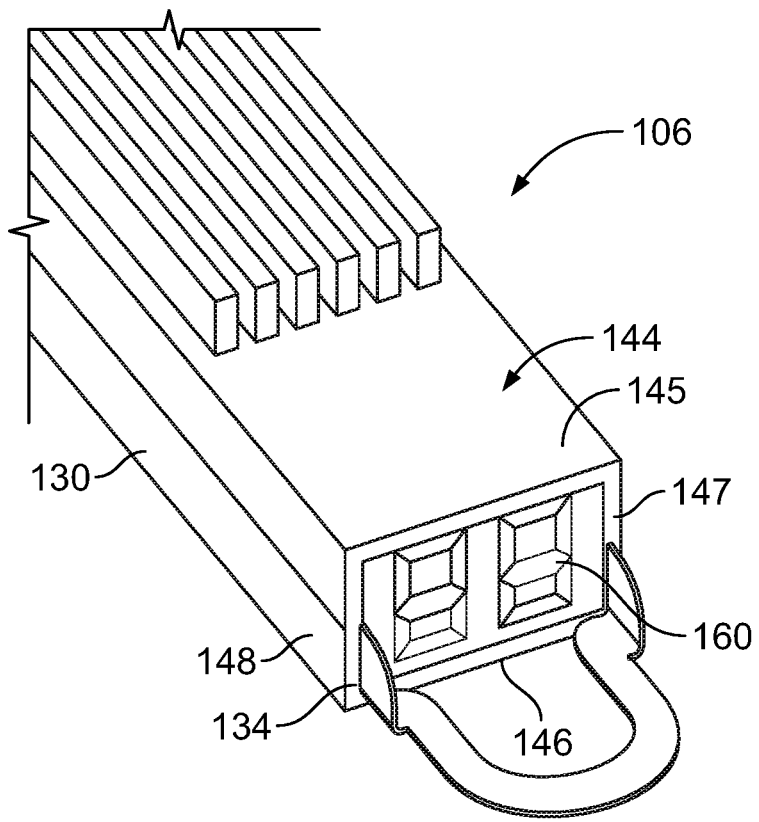
FIG. 3 is a front perspective view of the testing pluggable module in accordance with an exemplary embodiment.
Figure 4:
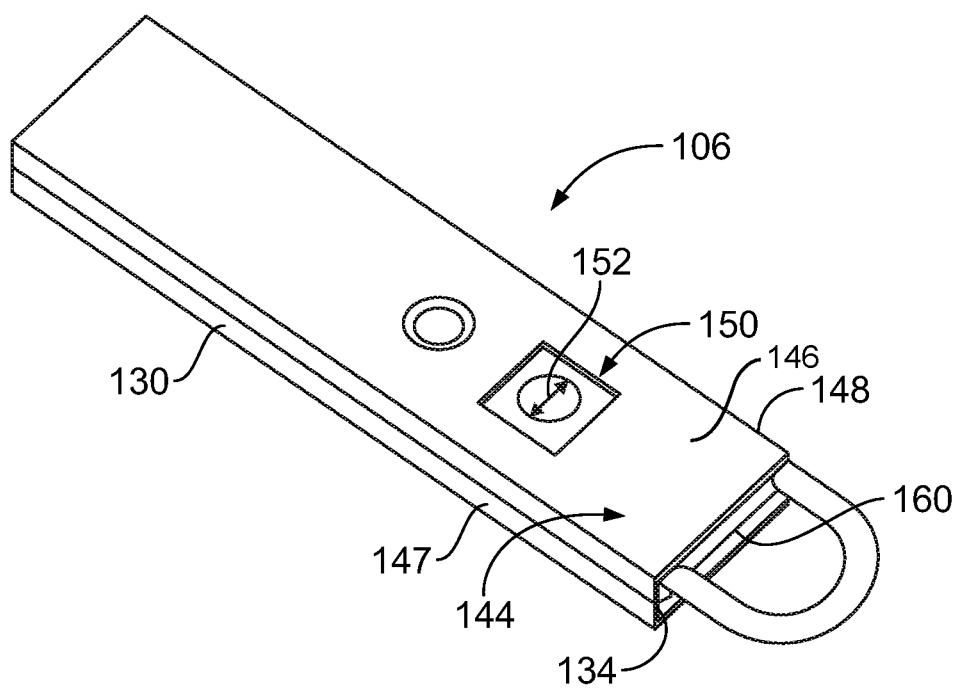
FIG. 4 is a bottom perspective view of the testing pluggable module in accordance with an exemplary embodiment.

In an exemplary embodiment, the pluggable body 130 provides heat transfer for the internal circuit board 138, such as for the electronic components on the internal circuit board 138. For example, the internal circuit board 138 is in thermal communication with the pluggable body 130 and the pluggable body 130 transfers heat from the internal circuit board 138. In an exemplary embodiment, the pluggable body 130 includes a plurality of heat transfer fins 136 along at least a portion of the outer perimeter of the pluggable module 106. For example, in the illustrated embodiment, the fins 136 are provided along the top 145; however the fins 136 may additionally or alternatively be provided along the sides 147, 148 and/or the bottom 146. The fins 136 transfer heat away from the main shell of the pluggable body 130, and thus from the internal circuit board and associated components. The fins 136 are separated by gaps that allow airflow or other cooling flow along the surfaces of the fins 136 to dissipate the heat therefrom. In the illustrated embodiment, the fins 136 are parallel plates that extend lengthwise; however the fins 136 may have other shapes in alternative embodiments, such as cylindrical or other shaped posts. FIG. 3 is a front perspective view of the testing pluggable module 106 in accordance with an exemplary embodiment. FIG. 4 is a bottom perspective view of the testing pluggable module 106 in accordance with an exemplary embodiment.

In an exemplary embodiment, the testing pluggable module 106 includes a user interface 150 that allows for user input to the testing circuit 140 (shown in FIG. 2). The user interface 150 is operably connected to the testing circuit 140. The user interface 150 may allow the user to control operation of the testing pluggable module 106 by interfacing directly with the testing circuit 140, as opposed to controlling the pluggable module through the interface with the communication connector 122 (shown in FIG. 1).

The user interface 150 includes an input 152 configured to operably control at least one testing function of the testing circuit 140. Optionally, the user interface 150 may include multiple inputs 152 and/or multiple user interfaces 150 may be provided each including one or more inputs 152. The input 152 is accessible at the exterior 144 of the testing pluggable module 106. For example, in the illustrated embodiment, the input 152 is provided at the bottom 146 of the pluggable module 106. However, the input 152 may be provided along other portions of the pluggable module 106, such as along the top 145 and/or the sides 147, 148. The user interface 150 may be provided at or near the front end 134. In various embodiments, the user interface 150 may be provided on the front end 134.

Optionally, the user interface 150 may be accessible on the pluggable body 130 when the pluggable body 130 is loaded into the module cavity 120 (shown in FIG. 1) of the receptacle assembly 104 (shown in FIG. 1) and mated with the communication connector 122 (shown in FIG. 1). As such, the user may adjust the input 152 when the testing pluggable module 106 is positioned in the receptacle assembly 104 and mated with the communication connector 122 to alter or change the testing functions of the testing circuit 140 while connected to the system. In alternative embodiments, the user interface 150 may be inaccessible when the testing pluggable module 106 is received in the receptacle assembly 104. Rather, the testing pluggable module 106 must be removed from the receptacle assembly 104 and adjusted prior to reloading the testing pluggable module 106 into the receptacle assembly 104.

In an exemplary embodiment, the input 152 is a physical input configured to be adjusted by the user. For example, the input 152 may be manually adjustable by the user. In an exemplary embodiment, the input 152 is a switch having multiple positions to control at least one testing function of the testing circuit 140. The input 152 allows direct user interaction with the testing circuit 140 to adjust or control the testing functions. The input 152 may be moveable relative to the pluggable body 130 to be adjusted by the user. For example, the input 152 may be a dial configured to be rotated relative to the pluggable body. The input 152 may be a button configured to be pressed into the pluggable body 130 or translated along the pluggable body 130 between various positions.

In other various embodiments, rather than being a physical input, the input 152 may be an electronic input. For example, the input 152 may interact with the testing circuit 140 electronically. The input 152 may be a touchscreen on the pluggable body 130. The input 152 may include a keypad or other interface to control the testing functions of the testing circuit 140.

In an exemplary embodiment, the testing pluggable module 106 includes a display 160 on the exterior of the pluggable body 130. The display 160 is operably connected to the testing circuit 140. The display 160 provides feedback to the user relating to the testing performed by the testing pluggable module 106. For example, the testing circuit 140 may generate an output relating to one or more testing functions of the testing circuit 140 and the display 160 displays information indicative of the output or result of the test being performed. The display 160 may display information indicative of user input to the testing circuit 140, such as through the input 152.

In an exemplary embodiment, the display 160 is a graphical display showing icons indicative of the output. For example, the display 160 may show numbers, letters and/or symbols. The display may be monochromatic or polychromatic. The display may extend in at least two-dimensions and have multiple display regions. The display regions may simultaneously display different outputs. For example, the display regions may display different numbers or symbols. The different display regions may be coordinated to provide the overall displayed image. For example, one display region may display one number or symbol or part of a number or symbol while another display region displays another number or symbol or part of a number or part of a symbol. One example may be a display that displays the number 5, where various display regions include an upper region, a right upper region, a left upper region, a middle region, a lower region, a lower right region and a lower left region. To display the number 5, the upper region, the upper left region, the middle region, the lower right region and the lower region are all activated while the upper right and the lower left regions are inactivated to display the number 5. In contrast, to show the number 1, the upper right region and the lower right region are activated while the other regions are inactive. The display may be configured to display more than two outputs (e.g., more than just being on and off, such as being able to display different numbers, letters, symbols, and the like).

The display 160 is visible from the exterior of the testing pluggable module 106. As such, the display is visible from the exterior of the receptacle assembly 104. In the illustrated embodiment, the display 160 is provided on the front end 134. In alternative embodiments, the display 160 may be provided at other locations on the exterior 144 of the pluggable body 130, such as at the top 145, the bottom 146 and/or the sides 147, 148. Optionally, the display 160 may be angled so that the display 160 is more visible to the user. Optionally, the display 160 may be integrated with the user interface 150. For example, the user interface 150 may be a touchscreen having the display 160.

Figure 5:
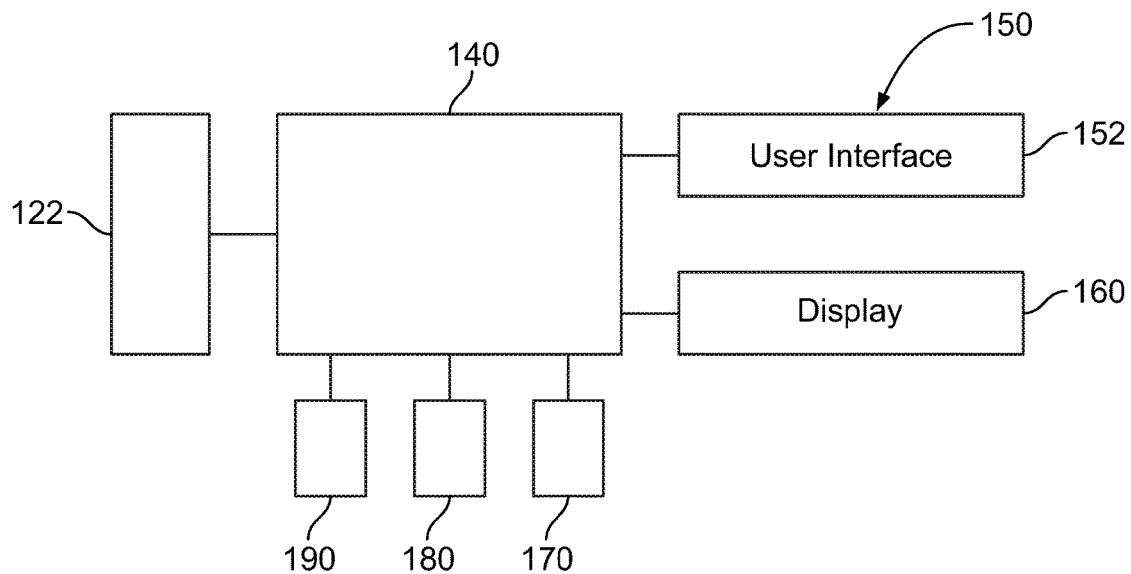
FIG. 5 is a schematic illustration of the testing pluggable module in accordance with an exemplary embodiment.

FIG. 5 is a schematic illustration of the testing pluggable module 106. The testing pluggable module 106 includes the testing circuit 140. The testing circuit 140 may be operably coupled to the communication connector 122, such as via the internal circuit board 138 (shown in FIG. 2) configured to be mated with the communication connector 122. Data may be transmitted between the communication connector 122 and the testing pluggable module 106. Optionally, the data may be communicated between the testing circuit 140 and the communication connector 122. For example, in an exemplary embodiment, at least a portion of the testing circuit 140 may be defined by circuits or traces or electronic components mounted to the internal circuit board 138.

In an exemplary embodiment, the input 152 of the user interface 150 is operably coupled to the testing circuit 140. The input 152 is configured to operably control at least one testing function of the testing circuit 140. In an exemplary embodiment, the display 160 is operably coupled to the testing circuit 140. The display 160 receives one or more outputs form the testing circuit 140 and displays information indicative of the output. Optionally, the input 152 and/or the display 160 may be electrically connected to the testing circuit 140 via the internal circuit board 138. For example, the input 152 and/or the display 160 may be mounted to the internal circuit board 138 or may be electrically connected to the internal circuit board 138 by a wired electrical connection or a wireless electrical connection.

In an exemplary embodiment, the testing pluggable module 106 includes a sensor assembly 170 operably coupled to the testing circuit 140. The sensor assembly 170 may include one or more sensors used by the testing pluggable module 106 during testing. For example, in various embodiments, the testing pluggable module 106 may be used for thermal testing. The sensor assembly 170 may include a temperature sensor for sensing temperature of the pluggable module 106 and/or of the receptacle assembly 104 (shown in FIG. 1).

In other various embodiments, the testing pluggable module 106 may be used for other types of testing, such as diagnostic testing of the data communication path of the communication system 100. For example, the testing pluggable module 106 may be used for diagnostic testing of the communication connector 122 or other components of the host system. The sensor assembly 170 may be used to sense data transmission to or from the communication connector 122. For example, the testing pluggable module 106 may be used to monitor the host system for diagnostic testing. The sensor assembly 170 may sense speed of signal transmission, timing characteristics, provide equalization testing, or perform other types of electrical testing.

Data received by the sensor assembly 170 may be displayed at the display 160. The input 152 may adjust or control the operation of the sensor assembly 170. For example, adjustments to the input 152 may change the type of data the sensor assembly 170 is used to sense. Adjustments made at the input 152 may turn one or more sensors off while turning other sensors on to control the type of testing being performed by the testing pluggable module 106.

Optionally, the testing pluggable module 106 may include a heat generator 180, which may be operably coupled to the testing circuit 140. The heat generator 180 is used to generate heat to simulate operation of the I/O pluggable module for testing operation of the communication system 100. For example, the testing pluggable module 106 may be used to test operation of the pluggable module 106, the communication connector 122 and/or other components of the communication system 100 at one or more temperature levels. The thermal testing may be used for pluggable module design, such as to test various materials of the pluggable body 130 for thermal design, to test the heat dissipating fin design, to test circuit board layout of the internal circuit board 138, or for other thermal testing of the pluggable module 106. The thermal testing may be used for receptacle assembly design, such as for thermal testing of the communication connector 122, for thermal testing of the cage member 108 (shown in FIG. 1), for thermal testing of heat sinks or other components added to the system for heat dissipation from the pluggable module, or for thermal testing of other components of the communication system 100.

In various embodiments, the heat generator 180 may be used to heat the pluggable module 106 to one or more pre-selected temperatures. Optionally, the input 152 may be used to control the heat generator 180. For example, the input 152 may be used to adjust the temperature of the heat generator 180. The input 152 may be used to control a mode of operation of the heat generator 180, such as between a power mode and a temperature mode, wherein in the temperature mode, the heat generator 180 is set to operate at a particular temperature and wherein, in the power mode, the heat generator 180 is set to operate at a particular power level, such as at 3 watts, 5 watts, 7 watts and the like.

During the thermal testing, performance of the testing pluggable module 106 within the communication system 100 may be monitored either directly through the testing pluggable module 106 and corresponding testing circuit 140 or alternatively may be monitored through the host communication system 100. For example, data may be transmitted from the testing pluggable module 106 to the communication connector 122 and the diagnostic testing may be done through the host communication system 100; however, the temperature of the testing pluggable module 106 may be controlled directly through the pluggable module 106 via the input 152.

Control of the heat generator 180 may be performed through direct user interaction with the pluggable module 106 at the user interface 150. The display 160 may provide feedback to the user during the testing, such as by providing the operating temperature, the operating mode, or other information. Additionally, the display 160 may provide feedback of the operation of the testing pluggable module 106 directly to the user relating to the performance of the testing pluggable module 106 rather than the user receiving such diagnostic information through the host communication system 100. As such, the testing data does not need to be transmitted across the interface with the communication connector for the user to access. Rather, the testing data may be received by the user directly from the pluggable module 106 at the display 160.

Optionally, the testing pluggable module 106 may include a signaling unit 190 operably coupled to the testing circuit 140. The signaling unit 190 is configured to transmit data signals to the communication connector 122 and/or receive data signals from the communication connector 122. The signaling unit 190 may be used for diagnostic testing of the pluggable module 106 and/or the other components of the communication system 100, such as the communication connector 122. The signaling unit may include a microcontroller or other electronic component.

The input 152 may be operably coupled to the signaling unit 190. The input 152 may control operating parameters of the signaling unit 190 for diagnostic testing of the components of the communication system 100. For example, the signaling unit 190 may control the types of data signals transmitted from the testing pluggable module 106, the speed of signaling from the testing pluggable module 106, the timing of signal transmission from the testing pluggable module 106, or other parameters used for testing the operation of the components of the communication system 100. The input 152 is changeable to alter the operating parameters of the signaling unit 190. As such, the signaling unit 190 may be controlled by direct user interaction with the testing pluggable module 106. The control signals for the signaling unit 190 do not need to be transmitted across the interface with the communication connector 122. Rather, the control may be provided by the user directly at the pluggable module 106 using the input 152. The display 160 displays information indicative of the diagnostic testing performed by the signaling unit 190 to provide feedback to the user during the diagnostic testing.

Figure 6:
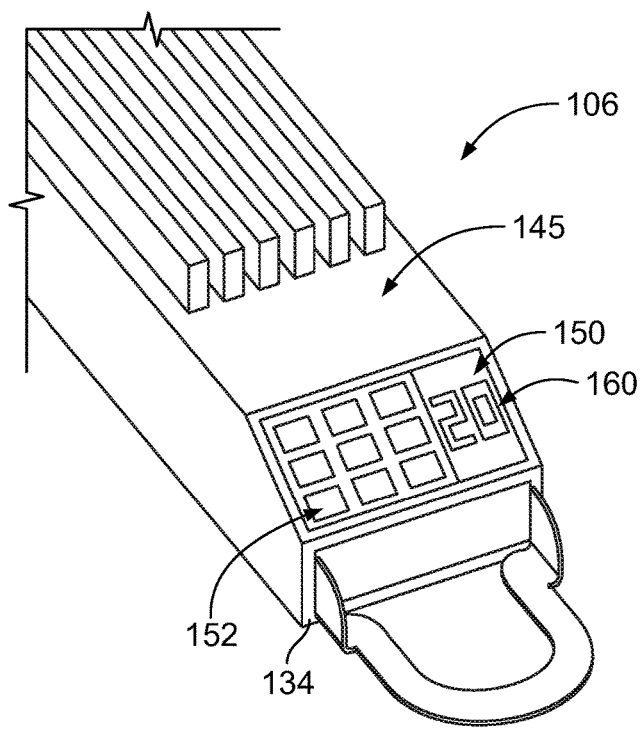
FIG. 6 is a front perspective view of the testing pluggable module in accordance with an exemplary embodiment.

FIG. 6 is a front perspective view of the testing pluggable module 106 in accordance with an exemplary embodiment. The testing pluggable module 106 shows the user interface 150 as a touch screen integrating the input 152 and the display 160 into the user interface 150. The display 160 is angled at the top 145 and the front end 134 for accessibility and viewability. The input 152 is represented on the left-hand side on the display 160 of the user interface 150 by graphical buttons. The output is displayed on the right-hand side of the display 160 by a graphical representation.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A testing pluggable module comprising:
   a pluggable body extending between a front end and a mating end defining a mating interface with a communication connector of a receptacle assembly, the mating end being receivable in a module cavity of the receptacle assembly to mate with the communication connector, the pluggable body having an exterior forward of the mating end;
   an internal circuit board held in the pluggable body, the internal circuit board having a testing circuit operating at least one testing function; and
   a user interface on the exterior of the pluggable body, the user interface having an input configured to operably control the at least one testing function of the testing circuit.

2. The testing pluggable module of claim 1, wherein the user interface is accessible on the pluggable body when the pluggable body is loaded in the module cavity of the receptacle assembly and mated with the communication connector.

3. The testing pluggable module of claim 1, wherein the input is a physical input configured to be adjusted by a user.

4. The testing pluggable module of claim 1, wherein the input is movable relative to the pluggable body between at least two positions.

5. The testing pluggable module of claim 1, wherein the input is a switch having multiple positions to control the at least one testing function.

6. The testing pluggable module of claim 1, wherein the user interface is a touch screen having at least one of multiple inputs.

7. The testing pluggable module of claim 1, wherein the input is an electronic input.

8. The testing pluggable module of claim 1, wherein the pluggable body includes a top, a bottom and sides therebetween defining the exterior, the user interface being provided on either the top or the bottom.

9. The testing pluggable module of claim 1, wherein the user interface is provided at the front end.

10. The testing pluggable module of claim 1, further comprising a display on the exterior of the pluggable body, the display receiving an output from the testing circuit and displaying information indicative of the output.

11. The testing pluggable module of claim 1, further comprising a heat generator held in the pluggable body and operably coupled to the test circuit, the input controlling operation of the heat generator.

12. The testing pluggable module of claim 11, wherein the input controls a temperature of the heat generator.

13. The testing pluggable module of claim 1, further comprising a signaling unit configured to at least one of transmit data signals to or receive data signals from the communication connector, the signaling unit being operably coupled to the testing circuit, the input controlling operating parameters of the signaling unit for diagnostic testing.

14. The testing pluggable module of claim 13, wherein the input is changeable to alter the operating parameters of the signaling unit.

15. A testing pluggable module comprising:
   a pluggable body extending between a front end and a mating end defining a mating interface with a communication connector of a receptacle assembly, the mating end being receivable in a module cavity of the receptacle assembly to mate with the communication connector, the pluggable body having an exterior forward of the mating end;
   an internal circuit board held in the pluggable body, the internal circuit board having a testing circuit operating at least one testing function, the testing circuit having an output based on at least one testing function;
   a user interface on the exterior of the pluggable body, the user interface having an input configured to operably control the at least one testing function of the testing circuit; and
   a display on the exterior of the pluggable body, the display receiving the output from the testing circuit and displaying information indicative of the output.

16. A testing pluggable module comprising:
   a pluggable body extending between a front end and a mating end defining a mating interface with a communication connector of a receptacle assembly, the mating end being receivable in a module cavity of the receptacle assembly to mate with the communication connector, the pluggable body having an exterior forward of the mating end;
   an internal circuit board held in the pluggable body, the internal circuit board having a testing circuit operating at least one testing function, the testing circuit having an output based on the at least one testing function; and
   a display on the exterior of the pluggable body, the display receiving the output from the testing circuit and displaying information indicative of the output.

17. The testing pluggable module of claim 16, wherein the display is a graphical display showing icons indicative of the output.

18. The testing pluggable module of claim 16, wherein the display is visible from the exterior of the receptacle assembly.

19. The testing pluggable module of claim 16, wherein the display is provided at the front end.

20. The testing pluggable module of claim 16, wherein the input and the display are integrated into the user interface.

* * * * *